United States Patent
Chen

(10) Patent No.: US 10,879,295 B2
(45) Date of Patent: Dec. 29, 2020

(54) DETECTION DEVICE

(71) Applicant: InnoLux Corporation, Miao-Li County (TW)

(72) Inventor: Yu-Heing Chen, Miao-Li County (TW)

(73) Assignee: INNOLUX CORPORATION, Miao-Li (TW)

( * ) Notice: Subject to any disclaimer, the term of this patent is extended or adjusted under 35 U.S.C. 154(b) by 158 days.

(21) Appl. No.: 16/162,458

(22) Filed: Oct. 17, 2018

(65) Prior Publication Data
US 2019/0148440 A1 May 16, 2019

(30) Foreign Application Priority Data

Nov. 13, 2017 (CN) .......................... 2017 1 1113032

(51) Int. Cl.
*H01L 27/146* (2006.01)
*G01T 1/20* (2006.01)
*H04N 5/32* (2006.01)
*G01T 1/24* (2006.01)

(52) U.S. Cl.
CPC ...... *H01L 27/14636* (2013.01); *G01T 1/2018* (2013.01); *H01L 27/14603* (2013.01); *H01L 27/14612* (2013.01); *H01L 27/14634* (2013.01); *H01L 27/14661* (2013.01); *H01L 27/14663* (2013.01); *G01T 1/247* (2013.01); *H04N 5/32* (2013.01)

(58) Field of Classification Search
CPC ........... H01L 27/14609; H01L 27/1461; H01L 27/14612; H01L 27/14614
See application file for complete search history.

(56) References Cited

U.S. PATENT DOCUMENTS

| 6,236,063 | B1* | 5/2001 | Yamazaki | G02F 1/13318 257/59 |
| 7,501,306 | B2* | 3/2009 | Nishi | H01L 27/1446 438/69 |
| 8,461,509 | B2* | 6/2013 | Koyama | H01L 27/14692 250/214 LA |
| 2006/0203139 | A1* | 9/2006 | Zhang | H04N 1/00129 349/43 |

(Continued)

FOREIGN PATENT DOCUMENTS

| CN | 202178256 U | 3/2012 |
| CN | 102565843 A | 7/2012 |
| CN | 205488131 U | 8/2016 |

OTHER PUBLICATIONS

Chinese office action dated Jun. 23, 2020, issued in application No. CN 201711113032.2.

*Primary Examiner* — John P. Dulka
(74) *Attorney, Agent, or Firm* — McClure, Qualey & Rodack, LLP

(57) ABSTRACT

A detection device is provided. The detection device includes a substrate having a first surface and a second surface, and the first surface is disposed opposite to the second surface. The detection device also includes a switch element disposed on the first surface, and a light sensing element disposed on the first surface and electrically connected to the switch element. The detection device also includes a first circuit disposed on the second surface. The substrate has a first through-via, and the switch element is electrically connected to the first circuit through the first through-via.

20 Claims, 10 Drawing Sheets

(56) References Cited

U.S. PATENT DOCUMENTS

| | | | |
|---|---|---|---|
| 2008/0308893 A1* | 12/2008 | Kirby | H01L 27/14632 |
| | | | 257/459 |
| 2010/0176271 A1* | 7/2010 | Rim | H01L 27/14634 |
| | | | 250/208.1 |
| 2010/0245647 A1* | 9/2010 | Honda | H01L 27/14636 |
| | | | 348/308 |
| 2012/0080600 A1 | 4/2012 | Fujiyoshi et al. | |
| 2012/0080605 A1 | 4/2012 | Kawanabe et al. | |
| 2015/0021081 A1 | 1/2015 | Mitarai et al. | |
| 2015/0084019 A1 | 3/2015 | Ren | |
| 2015/0325630 A1 | 11/2015 | Yoo et al. | |
| 2016/0021746 A1 | 1/2016 | Wright et al. | |
| 2020/0145600 A1* | 5/2020 | Yamamoto | H04N 5/3745 |

* cited by examiner

DETECTION DEVICE

CROSS REFERENCE TO RELATED APPLICATIONS

This application claims priority of Chinese Patent Application No. 201711113032.2, filed on Nov. 13, 2017, the entirety of which is incorporated by reference herein.

BACKGROUND

Technical Field

The present disclosure relates to a detection device and a method of forming the detection device. The disclosure in particular relates to a light detecting device and a method of forming the light detecting device.

Description of the Related Art

In a detecting device, electronic signal affect the quality of the image. Therefore, decreasing the interference of noise is an effective way to enhance the image quality of the detecting device. The noise may arise from the capacitance generated between the gate and the data line, the capacitance generated between the data line and the scan line, the capacitance between the drain/source and the gate of the thin-film transistor, or the resistance generated from the data line, the scan line, the drain, the source, or the gate element per se. Among them, the resistance of the data line or the capacitance generated between the data line and other elements are the major sources of noise. Noise can be reduced by reducing the capacitance between the data line and other elements, such as reducing the width of the data line, or increasing the distance between the data line and the photodiode. However, the above methods for reducing the noise may decrease the effective area of the detecting unit of the detecting device, and decrease the performance of the detecting device. There is a trade-off relationship between reducing of the noise and decreasing of the effective area of the detecting device.

Accordingly, how to reduce the noise in the detecting device and increase the performance of the detecting device is one of the topics on which the current industry has focused.

SUMMARY

In accordance with some embodiments of the present disclosure, a detection device is provided. The detection device comprises a substrate having a first surface and a second surface, and the first surface is disposed opposite to the second surface. The detection device also comprises a switch element, a light sensing element and a first circuit. The switch element is disposed on the first surface, and the light sensing element is disposed on the first surface and electrically connected to the switch element. The first circuit is disposed on the second surface. The substrate has a first through-via, and the switch element is electrically connected to the first circuit through the first through-via.

In accordance with some embodiments of the present disclosure, a detection device is provided. The detection device comprises a substrate having a first surface and a second surface, and the first surface is disposed opposite to the second surface. The detection device also comprises a switch element, a light sensing element, and a first circuit. The switch element is disposed on the second surface, the light sensing element is disposed on the first surface. The substrate has a first through-via, and the switch element is electrically connected to the light sensing element through the first through-via.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1A:
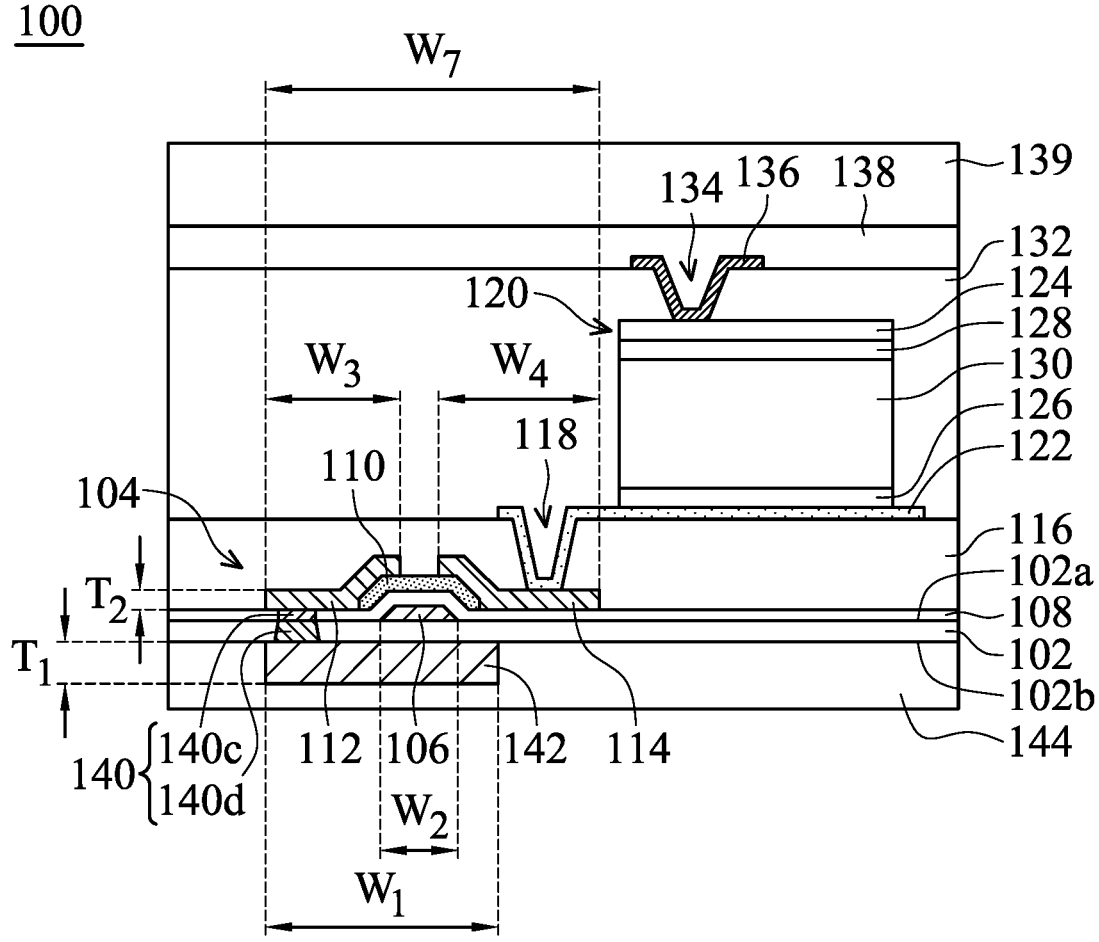
FIG. 1A illustrates a cross-sectional view of a partial structure of a detection device in accordance with some embodiments of the present disclosure.

The detection device of the present disclosure and the manufacturing method thereof are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those with ordinary skill in the art. In addition, the expressions "a layer overlying another layer", "a layer is disposed above another layer", "a layer is disposed on another layer" and "a layer is disposed on another layer" may indicate that the layer is in direct contact with the other layer, or that the layer is not in direct contact with the other layer, there being one or more intermediate layers disposed between the layer and the other layer.

It should be understood that, although the terms first, second, third etc. may be used herein to describe various elements, components, regions, layers, portions and/or sections, these elements, components, regions, layers, portions and/or sections should not be limited by these terms. These terms are used to distinguish one element, component, region, layer, portion or section from another region, layer or section. Thus, a first element, component, region, layer, portion or section discussed below could be termed a second element, component, region, layer, portion or section without departing from the teachings of the present disclosure.

It should be understood that this description of the exemplary embodiments is intended to be read in connection with the accompanying drawings, which are to be considered part of the entire written description. The drawings are not drawn to scale. In addition, structures and devices are shown schematically in order to simplify the drawing.

The terms "about" and "substantially" typically mean +/−20%, +/−10%, +/−5%, +/−3%, +/−2%, +/−1% or +/−0.5% of the stated value. The stated value of the present disclosure is an approximate value. When there is no specific description, the stated value includes the meaning of "about" or "substantially".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In addition, in some embodiments of the present disclosure, terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

In the detection device provided in the present disclosure, the circuit (such as the data line or the scan line) or the thin-film transistor is transferred to the side of the substrate that is opposed to the photodiode. Therefore, the size of the circuit may be less restricted by the photodiode. The data line or the scan line having a greater width or a greater thickness may be formed, the capacitance or the resistance of the data line (and/or the scan line) may be decreased, and thus the noise is reduced. Accordingly, the performance of the detection device may be enhanced. In addition, the detection rate in the detection area of the detection unit of the detection device will not be affected by transferring the circuit or the thin-film transistor to the side of the substrate that is opposed to the photodiode.

The detecting devices may be display detecting devices, light detecting devices, antenna, tiled detecting device, but they are not limited thereto. In addition, the detecting devices may be applied in medical diagnostic aids, such as X-ray detectors, which are used in photography of human breast tissue, cardiovascular systems, and so on.

FIG. 1A illustrates a cross-sectional view of a partial structure of a detection device 100 in some embodiments. FIG. 1A corresponds to the cross-sectional view along line A-A' in FIG. 1B, i.e. the cross-sectional view of the detection device 100 in an X-Z plane. In FIG. 1A, the detection device 100 comprises a substrate 102. The substrate 102 comprises a first surface 102a and a second surface 102b. The first surface 102a is disposed opposite to the second surface 102b. The Z direction may be defined as the normal direction of the substrate 102, the Z direction is perpendicular to the X-Y plane. The material of the substrate 102 may include glass, quartz, sapphire, polycarbonate (PC), polyimide (PI), polyethylene terephthalate (PET), any other suitable substrate material, or a combination thereof, but it is not limited thereto. The first surface 102a of the substrate 102 or the second surface 102b of the substrate 102 may include a buffer layer (not illustrated). A switch element 104 may be disposed on the first surface 102a. The switch element 104 may be a thin-film transistor, but it is not limited thereto. The switch element 104 may include a gate electrode 106, a semiconductor layer 110 (i.e. an active layer), a first electrode 112 and a second electrode 114. The first electrode 112 may be either the source electrode or the drain electrode, and the second electrode 114 may be the other of the source electrode or the drain electrode. For example, while the first electrode 112 is the source electrode, the second electrode 114 is the drain electrode. In some embodiments, the first electrode 112 and the second electrode 114 may be interchangeable.

As shown in FIG. 1A, the gate electrode 106 is disposed on the first surface 102a of the substrate 102. A gate dielectric layer 108 is disposed on the gate electrode 106 and the substrate 102. The material of the gate electrode may include conductive metals or transparent conductive materials, such as molybdenum, tungsten, titanium, tantalum, platinum, hafnium, ruthenium metal oxide or indium tin metal oxide, but is not limited thereto.

The material of the gate dielectric layer 108 may include silicon oxide, silicon nitride, silicon oxynitride, any other suitable dielectric material, or a combination thereof, but is not limited thereto.

The semiconductor layer 110 may be disposed on the gate dielectric layer 108 and the gate electrode 106. The first electrode 112 and the second electrode 114 may be respectively disposed at the opposite sides of the semiconductor layer 110. The first electrode 112 and the second electrode 114 may partially cover the semiconductor layer 110, and expose a portion of the surface of the semiconductor layer 110. The first electrode 112 or the second electrode 114 may directly contact with the semiconductor layer 110. In some embodiments, the first electrode 112 or the second electrode 114 may directly contact with the semiconductor layer 110 through other conductive layers (not illustrated), which is not particularly limited in the present disclosure.

The material of the semiconductor may include silicon (Si) or germanium (Ge), gallium nitride, silicon carbide, gallium arsenide, gallium phosphide, indium phosphide, silicon germanium alloy, phosphorus arsenic gallium alloy or arsenic aluminum indium alloy, but is not limited thereto.

The material of the first electrode 112 or the second electrode 114 may include conductive metals or transparent conductive materials. The material of the first electrode 112 and the second electrode 114 each may include copper, aluminum, molybdenum, tungsten, gold, chromium, nickel, platinum, titanium, copper alloys, aluminum alloys, molybdenum alloys, tungsten alloys, gold alloys, ITO, IZO, IGZO, ITZO, any other suitable materials, or a combination thereof, but is not limited thereto.

It should be understood that although the switch element 104 is a bottom gate thin-film transistor in figures, the switch element 104 may be a top gate thin-film transistor in some embodiments, which is not particularly limited.

Referring to FIG. 1A, the detection device 100 may further include a first insulating layer 116, and the first insulating layer 116 may be disposed on the switch element 104 and the substrate 102. The material of the first insulating layer 116 may include silicon nitride, silicon dioxide, silicon oxynitride, any other suitable dielectric material, or a combination thereof, but is not limited thereto. The first insulating layer 116 may include at least one through-hole 118. The through-hole 118 may expose a part of the surface of the second electrode 114.

The detection device 100 may further comprise at least one light sensing element 120. The light sensing element 120 may be disposed on the first insulating layer 116. The light sensing element 120 may be a photodiode, but is not limited thereto. For example, the detection device 100 may be an X-ray detection device, which may further comprise a scintillating layer 139 in some embodiments. The scintillating layer 139 may be disposed on the first surface 102a. The scintillating layer 139 may be disposed on the light sensing element 120. The light sensing element 120 may be disposed between the substrate 102 and the scintillating layer 139. Specifically, the X-ray tube emits X-ray photons, and the X-ray photons may penetrate the detecting target object. A part of the X-ray photons may not be absorbed by the target object, and another part of the X-ray photons may impact the scintillating layer 139. As such, the scintillating layer 139 may convert the X-ray photons into visible photons. The visible photons are converted into electric charges by the photodiode, the electric charges are stored within the detection pixels. Subsequently, when the switch element 104 is turned on, the electric charges may be read out and generate the corresponding data. The data may be converted to an image by calculation. The material of the scintillating layer 139 may include cesium iodide (CsI), sodium iodide (NaI), thallium iodide (TlI) or any other suitable material with appropriate absorption characteristics to the X-ray, but is not limited thereto.

The light sensing element 120 may further comprise a first electrode layer 122, a second electrode layer 124, a first-type semiconductor layer 126, a second-type semiconductor layer 128 and an active layer 130. The first electrode layer 122 may be disposed on the first insulating layer 116, and the first electrode layer 122 may be disposed in the through-hole 118. In addition, the first electrode layer 122 may be electrically connected to the switch element 104 through the portion of the first electrode layer 122. The first electrode layer 122 may be disposed on the sidewalls of the through-hole 118 or the surface of the second electrode 114. In some embodiments, the first electrode layer 122 may be disposed on the through-hole 118, or the surface of the second electrode 114, and the first electrode layer 122 is electrically connected to the second electrode 114. The first electrode layer 122 may include metallic conductive materials. The metallic conductive material may include copper, aluminum, molybdenum, tungsten, gold, chromium, nickel, platinum, titanium, any other suitable conductive materials, or a combination thereof, but is not limited thereto. In some embodiments, when the first electrode layer 122 is a reflective material, the light sensing element 120 may at least partially overlap the switch element 104 in the normal direction of the substrate 102 (the Z direction).

The second electrode layer 124 may be disposed on and corresponding to the first electrode layer. The second electrode layer 124 may include the transparent conductive materials. The transparent conductive material may include ITO, SnO, IZO, IGZO, ITZO, ATO, AZO, any other suitable material, or a combination thereof, but is not limited thereto. Since the second electrode layer 124 includes the transparent conductive material, the visible photons may be detected by the light sensing element 120. In FIG. 1A, the first electrode layer 122 serves as the bottom electrode of the light sensing element 120, and the second electrode layer 124 serves as the top electrode of the light sensing element 120.

In addition, an area of the first electrode layer 122 on the substrate 102 in the normal direction of the substrate 102 may be greater than or equal to an area of the second electrode layer 124 on the substrate 102 in the normal direction of the substrate 102, but is not limited thereto. The area of the first electrode layer 122 or the area of the second electrode layer 124 can be observed by optical microscope (OM).

The first-type semiconductor layer 126, the active layer 130 and the second-type semiconductor layer 128 may be sequentially disposed between the first electrode layer 122 and the second electrode layer 124. The active layer 130 may be disposed between the first-type semiconductor layer 126 and the second-type semiconductor layer 128. The first-type semiconductor layer 126 and the second-type semiconductor layer 128 respectively may be the semiconductor layers having different electrical properties. In some embodiments, the first-type semiconductor layer 126 is an n-type semiconductor layer while the second-type semiconductor layer 128 is a p-type semiconductor layer. In some embodiments, the first-type semiconductor layer 126 is a p-type semiconductor layer while the second-type semiconductor layer 128 is an n-type semiconductor layer. The first-type semiconductor layer 126 and the second-type semiconductor layer 128 may include the III-V compounds with different conductivity types. The p-type semiconductor layer may include amorphous semiconductor having dopants of group III element such as boron, aluminum, gallium, or any other suitable doping elements, but is not limited thereto. The n-type semiconductor layer may include amorphous semiconductor having dopants of group V element such as nitrogen, phosphorus, arsenic, or any other suitable doping elements, but is not limited thereto.

Still referring to FIG. 1A, the detection device 100 may further include a second insulating layer 132, and the second insulating layer 132 may be disposed on (or cover) the light sensing element 120. The material of the second insulating layer 132 may include perfluoroalkoxy alkane (PFA), polytetrafluoroethylene (PTFE), fluorinated ethylene propylene (FEP), polyethylene, any other suitable insulating material, or a combination thereof, but is not limited thereto. In addition, the second insulating layer 132 may comprise a through-hole 134. The through-hole 134 may expose a part of the surface of the second electrode layer 124.

The detection device 100 may further comprise a third electrode layer 136. The third electrode layer 136 may be disposed on the second insulating layer 132, and the third electrode layer 136 may be disposed in the through-hole 134. Specifically, the third electrode layer 136 may be disposed on the sidewalls of the through-hole 134 or the surface of the second electrode layer 124. In some embodiments, the third electrode layer 136 may be disposed on (or cover) the sidewalls of the through-hole 134 or the surface of the second electrode layer 124. The third electrode layer 136 may be in contact with or electrically connected to the part of second electrode layer 124 that is exposed. The third electrode layer 136 may serve as a readout line, and the readout line may be electrically connected to an external circuit, but is not limited thereto. The third electrode layer 136 may transmit the detected signal to the external circuit through a charge integrator amplifier. The third electrode layer 136 may include transparent conductive materials or metallic conductive materials. The transparent conductive material may include ITO, IZO, IGZO, ITZO, any other suitable transparent conductive materials, or a combination thereof, but is not limited thereto. The metallic conductive material may include copper, aluminum, molybdenum, tungsten, gold, chromium, nickel, any other suitable conductive materials, or a combination thereof, but is not limited thereto. When the third electrode layer 136 is "a line", the third electrode layer 136 may include metallic conductive material. When the third electrode layer 136 is "a layer", the third electrode layer 136 may include transparent conductive material, but it is not limited thereto. Furthermore, the detection device 100 may further comprise a fourth insulating layer 138. The fourth insulating layer 138 may be disposed on the light sensing element 120 and the third electrode layer 136 for protection or insulation. The scintillating layer 139 may be disposed on the fourth insulating layer 138. As described above, the first electrode layer 122 of the light sensing element 120 may be electrically connected to the second electrode 114 of the switch element 104 through the through-hole 118. The second electrode layer 124 of the light sensing element 120 may be electrically connected to the third electrode layer 136 through the through-hole 134.

Still referring to FIG. 1A, the substrate 102 may further comprise a first through-via 140 and a first circuit 142, the first circuit 142 may be disposed on the second surface 102b of the substrate 102. For example, the first through-via 140 may be disposed corresponding to the switch element 104, and the first through-via 140 may penetrate the substrate 102. The switch element 104 may be electrically connected to the first circuit 142 through the first through-via 140. The first through-via 140 may be disposed corresponding to the first electrode 112 in some embodiments. The first through-via 140 may be disposed between the first electrode 112 of the switch element 104 and the first circuit 142. The first circuit 142 may be the data line, and the first electrode 112 may be electrically connected to the first circuit 142 in some embodiments. In one embodiment, the first circuit 142 and most of the elements of the switch element 104 (i.e. the first electrode 112, the second electrode 114, the gate electrode 106) may be disposed on the opposite surfaces of the substrate 102. In some embodiments, the first through-via 140 may comprise a conductive material 140d that penetrates the substrate 102, and/or a conductive material 140c that penetrates the gate dielectric layer 108. The number of the layer that is penetrated through by the first through-via 140 may be adjusted depending on a process of forming the transistor. The number of the layer that is penetrated through by the first through-via 140 may be different according to the type of thin-film transistor, such as the bottom gate transistor, the top gate transistor, the low temperature polycrystalline silicon (LTPS) transistor, IGZO transistor, or amorphous silicon (a-Si) transistor. The number of the layer that is penetrated through by the first through-via 140 is not particularly limited. Moreover, in some embodiments, the first through-via 140 may be electrically connected to the first electrode 112 through another conductive layer (not illustrated) disposed corresponding to the detection area. The first through-via 140 may be disposed corresponding to the conductive layer. In other words, the first electrode 112 may be electrically connected to the first circuit 142 through the first through-via 140 and the above conductive layer, but it is not limited thereto. In addition, the conductive layer may include transparent conductive materials or metal conductive materials, but it is not limited thereto.

As described above, in this embodiment, the first circuit 142 disposed on the second surface 102b may be electrically connected to one end of the thin-film transistor through the first through-via 140. In one embodiment, the size of the first circuit 142 (such as the data line) may not be restricted by the switch element 104 or the light sensing element 120. The first circuit 142 (the data line) may have a wider width or a thicker thickness, as compared to the conventional detection device where the data line is disposed on the same side with the switch element 104 or the light sensing element 120.

In some embodiments, the first circuit 142 may have a first thickness $T_1$. The first thickness $T_1$ may be the maximum thickness of the first circuit 142 in a relatively planar partial region in the normal direction of the substrate 102 (Z direction). Generally, the thickness of the first circuit 142 is uneven at the position where the first circuit 142 overlaps the first through-via 140 in the Z direction. The relatively planar partial region of the first circuit 142 as described above is a region that avoids having an uneven thickness. For example, the relatively planar partial region of the first circuit 142 may exclude a region that corresponds to the first through-via 140. In addition, the first electrode 112 has a second thickness $T_2$. The second thickness $T_2$ may be the maximum thickness of the first electrode 112 in a relatively planar partial region in the Z direction. Generally, the thickness of the first electrode 112 is uneven at the position where the first electrode 112 overlaps the first through-via 140 in the Z direction. The relatively planar partial region of the first electrode 112 as described above is a region that avoids having an uneven thickness. In some embodiments, the first thickness $T_1$ may be greater than or equal to the second thickness $T_2$. In some embodiments, the first thickness $T_1$ may be in a range from about 200 nm to 1000 nm (200 nm≤first thickness $T_1$≤1000 nm). In some embodiments, the first thickness $T_1$ may be in a range from about 500 nm to 1000 nm (500 nm first thickness $T_1$≤1000 nm). If the first thickness $T_1$ is too small (<200 nm), the first circuit 142 may not be able to effectively decrease the capacitance or resistance. On the contrary, if the first thickness $T_1$ is too great (>1000 nm), the stress on the substrate may be increased and cause the substrate to bend or crack, or increase the manufacturing cost. The thickness of the above elements (or layers) can be measured by a scanning electron microscope (SEM), and under a cross-sectional view of the elements (or layers), and the depth of field is approximately 1000 nm to 20000 nm, and the maximum thickness of the elements (or layers) in the SEM image is measured. The thickness of the above elements (or layers) can be measured by other suitable measurement methods. The depth of field of the SEM image is not limited to the above range, and the depth of field can be adjusted according to the thickness of the actual elements (or layers).

Figure 1B:
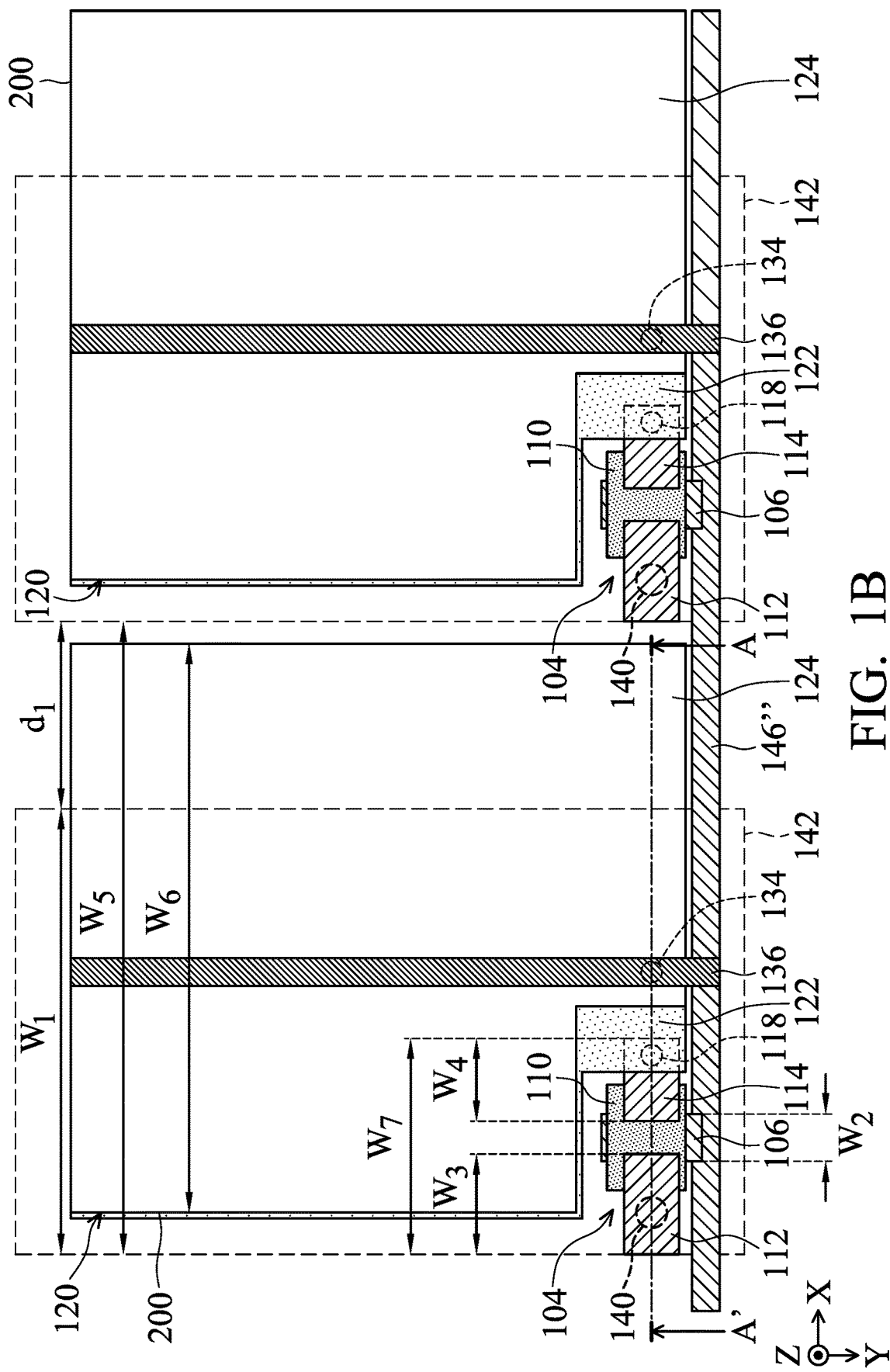
FIG. 1B illustrates a top view of a partial structure of a detection device in accordance with some embodiments of the present disclosure.

In some embodiments, the first circuit 142 has a first width $W_1$ in the X direction. For example, the X direction may be a direction, which is substantially parallel to a scan line 146" (as shown in FIG. 1B). In some embodiments, the gate electrode 106 has a second width $W_2$ in the X direction, the first electrode 112 has a third width $W_3$ in the X direction, the second electrode 114 has a fourth width $W_4$ in the X direction, the switch element 104 has a seventh width $W_7$ in the X direction. In some embodiments, the first width $W_1$ is greater than or equal to the second width $W_2$, the third width $W_3$ or the fourth width $W_4$. In some embodiments, the first width $W_1$ is greater than or equal to the seventh width $W_7$. The second electrode layer 124, the first electrode layer 122, the first-type semiconductor layer 126, the active layer 130 and the second-type semiconductor layer 128 of the light sensing element 120 have an overlapping area in the normal direction of the substrate 102. This overlapping area may define a detection area. The detection area has a sixth width $W_6$ in the X direction (as shown in FIG. 1B). In some embodiments, the first circuit 142 (the data line) may further overlap a portion of the light sensing element 120 in the normal direction of the substrate 102. In some embodiments, the first width $W_1$ may about be in a range from 10 µm to 50 µm (10 µm≤first width $W_1$≤50 µm), or from 30 µm to 50 µm (30 µm≤first width $W_1$≤50 µm), but it is not limited thereto. The first width $W_1$ may be adjusted according to the resolution of the detection device 100. It should be noted that the width of the above components can be measured by an optical microscope (OM). For example, a length (and/or a width) of an OM image is in a range from 100 µm to 2000 µm, but it is not limited to the above range. The length (and/or a width) of the OM image can be adjusted according to the actual width of the above components. The width of the above components can be measured by other suitable measurement methods.

The material of the conductive material 140c, the conductive material 140d or the first circuit 142 may include transparent conductive materials or metallic conductive materials, but is not limited thereto. The metallic conductive materials or transparent conductive materials are as described above and will not be repeated here. In some embodiments, the materials of the conductive material 140c (and/or the conductive material 140d) and the material of the first circuit 142 may be the same or different. In addition, an area of the bottom electrode of the light sensing element 120 on the substrate 102 in the normal direction of the substrate 102 may be greater than or equal to an area of the top electrode on the substrate 102 in the normal direction of the substrate 102.

The detection device 100 may further comprise a third insulating layer 144, and the third insulating layer 144 is disposed on (or cover) the first circuit 142 and the second surface 102b. In other words, the first circuit 142 may be disposed between the third insulating layer 144 and the substrate 102. In some embodiments, the material of the third insulating layer 144 may include polyimide, any other suitable insulating material, or a combination thereof, but is not limited thereto. The third insulating layer 144 may reduce the possibility of the first circuit 142 from being directly contacted with air or vapor. Thus, the electricity of the first circuit 142 may not be affected.

It should be understood, the detection device 100 may comprise a plurality of pixel units, each of the pixel units respectively include a switch element 104 and a light sensing element 120.

FIG. 1B illustrates a top view of a partial structure of the detection device 100 in some embodiments. FIG. 1B illustrates the schematic view of partial pixel units of the detection device 100 in FIG. 1A. It should be understood that, although two pixel units 200 are illustrated in FIG. 1B, the detection device 100 may comprise a plurality of pixel units 200. Moreover, some of the elements are omitted in FIG. 1B to clearly illustrate the relationship of the first circuit 142 (the data line), the scan line 146", the switch element 104, the light sensing element 120 and the first through-via 140.

As shown in FIG. 1B, the detection device 100 comprises the scan line 146" that extends along the X direction, and the detection device 100 comprises the first circuit 142 (the data line) that intersects with the scan line 146". Since the first circuit 142 is disposed on the second surface 102b of the substrate 102 (i.e. the back side of the figure), the first circuit 142 is represented by dotted lines. For example, the scan line 146" extends along the X direction and the first circuit 142 is substantially perpendicular to the scan line 146". In other words, the first circuit 142 may extend along the Y direction. The scan line 146" and the first circuit 142 may be disposed intersecting with each other to define the pixel unit 200. The pixel unit 200 may comprise the switch element 104. The scan line 146" may provide a pulse signal to the switch element 104 to control the switch of the pixel unit 200. Furthermore, as shown in FIG. 1B, a pixel area of a pixel unit 200 of the detection device may be defined by two adjacent first circuits 142, and two adjacent first circuits 142 are parallel to each other in the X direction. The pixel area has a fifth width W5. The fifth width W5 may represent the width distance in the X direction from the leftmost end of the first circuit 142 to the leftmost end of the next adjacent first circuit 142.

The gate electrode 106 and the scan line 146" may be electrically connected. In some embodiment, the gate electrode 106 and the scan line 146" may include the same conductive material, and the gate electrode 106 and the scan line 146" may be formed by the same process (such as photolithography process or etching process, but it is not limited thereto). The first electrode 112 and the first circuit 142 may be electrically connected. The first electrode 112 and the first circuit 142 may include the same or different conductive materials. Specifically, the first electrode 112 of the switch element 104 may be electrically connected to the first circuit 142 through the first through-via 140, and the first through-via 140 penetrates the substrate 102. The first through-via 140 (which is represented by the dotted circle) is disposed below and corresponding to the first electrode 112. As described above, the first circuit 142 is disposed on the second surface 102b of the substrate 102. The width of the first circuit 142 or the thickness of the first circuit 142 may be unrestricted by the elements disposed on the first surface 102a. Therefore, the first circuit 142 may have a wider width or a thicker thickness than the conventional detection device. The capacitance of the first circuit 142 or the resistance of the first circuit 142 may be decreased. For example, the width of the data line in the traditional detection device occupies about 5% to 10% of the width $W_5$ of the pixel area. With such a configuration, the sixth width W6 of the light sensing element 120 may be unrestricted by the first circuit 142, and thus the detection area having a greater area, or the detection performance may be enhanced. The sixth width $W_6$ is defined as the maximum width of the detection area in the X direction. The detection area is located at the region where the first electrode layer 122, the second electrode layer 124, the first-type semiconductor layer 126, the active layer 130 and the second-type semiconductor layer 128 overlap in the normal direction of the substrate 102.

In some embodiments, the first width $W_1$ is about 5% to 80% of the width $W_5$ of the pixel area (5%≤first width $W_1$/width $W_5$ of the pixel area≤80%). In some embodiments, the first width $W_1$ is about 50% to 80% of the width $W_5$ of the pixel area (50%≤first width $W_1$/width $W_5$ of the pixel area≤80%). If the first width W1 is too small (e.g., first width $W_1$/width $W_5$ of the pixel area<5%), the data line may not effectively reduce the capacitance or resistance. On the contrary, if the first width $W_1$ is too great (e.g., first width $W_1$/width $W_5$ of the pixel area>80%), the distance between the adjacent data lines may be too small and may result in the risk of short circuit. A sufficient space $d_1$ need to be maintained for preventing short circuit. The above space $d_1$ is defined as the distance between the two adjacent first circuits 142.

In some embodiments, the first circuit 142 at least partially overlaps the switch element 104 in the normal direction of the substrate 102. In some embodiments, the first circuit 142 at least partially overlaps the light sensing element 120 in the normal direction of the substrate 102.

Figure 2A:
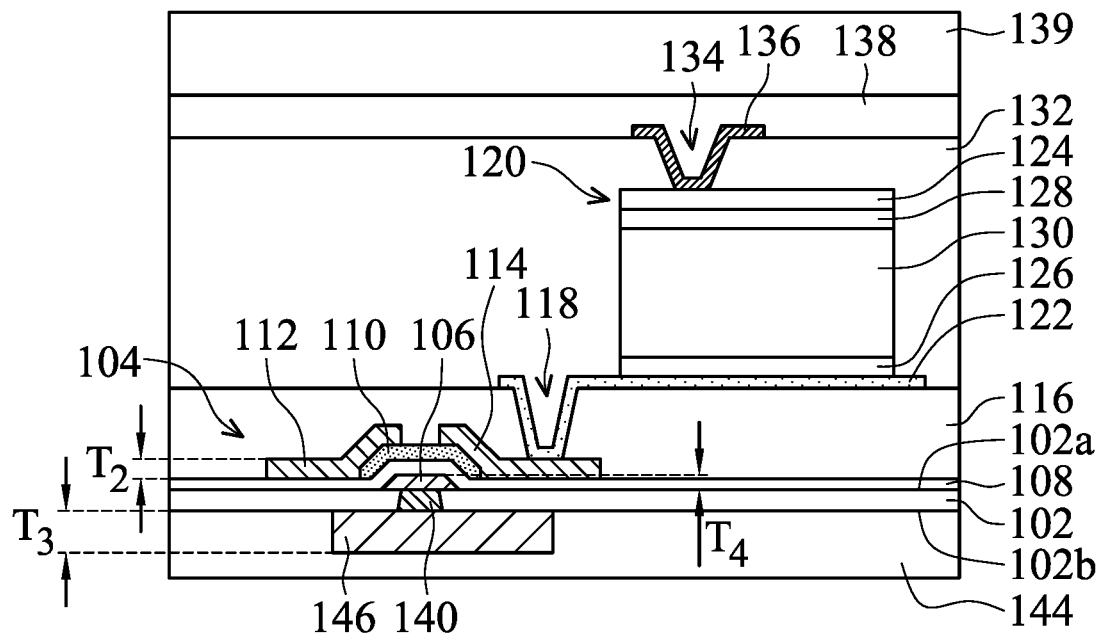
FIG. 2A illustrates a cross-sectional view of a partial structure of a detection device in accordance with some embodiments of the present disclosure.

Referring to FIG. 2A, FIG. 2A illustrates a cross-sectional view of a partial structure of a detection device 300 in some embodiments. FIG. 2A corresponds to the cross-sectional view along line B-B' in FIG. 2B. It should be understood that, the same or similar components or the elements will be denoted by the same or similar reference numerals. The materials, manufacturing methods and functions of these components or elements are the same or similar to those described above, and will not be repeated herein.

The difference between the embodiments shown in FIG. 2A and FIG. 1A is that the first circuit 146 (the scan line) is disposed on the second surface 102b of the substrate 102 in the switch element 104 shown in FIG. 2A. Specifically, in this embodiment, the first through-via 140 is disposed corresponding to the gate electrode 106 of the switch element 104 and penetrates through the substrate 102. The first through-via 140 is disposed between the gate electrode 106 of the switch element 104 and the first circuit 146, and the gate electrode 106 is electrically connected to the first circuit 146 through the first through-via 140. In one embodiment, the first circuit 146 and most elements of the switch element 104 (i.e. the first electrode 112, the second electrode 114, the gate electrode 106 and so on) are disposed at the opposite sides of the substrate 102.

In one embodiment, the first circuit 146 may extend to the second surface 102b through the first through-via 140 that penetrates through the substrate 102. The size of the first circuit 146 may be unrestricted by the switch element 104 or the light sensing element 120. Therefore, the first circuit 146 may have a wider width or a thicker thickness in this embodiment, as compared to the conventional detection device where the scan line is disposed on the same side with most elements of the switch element 104 or the light sensing element 120.

In some embodiments, the first circuit 146 has a first thickness $T_3$. For example, the first thickness $T_3$ may be the maximum thickness of the first circuit 146 in a relatively planar partial region in the Z direction. Generally, the thickness of the first circuit 146 is uneven at the position where the first circuit 146 overlaps the first through-via 140 in the Z direction. The relatively planar partial region of the first circuit 146 as described above is a region that avoids having an uneven thickness. For example, the relatively planar partial region of the first circuit 146 may exclude a region that corresponds to the first through-via 140. In addition, the gate electrode 106 has a third thickness $T_4$. The third thickness $T_4$ may be the maximum thickness of the gate electrode 106 in a relatively planar partial region in the Z direction. Generally, the thickness of the gate electrode 106 is uneven at the position where the gate electrode 106 overlaps the first through-via 140 in the normal direction of the substrate 102. The relatively planar partial region of the gate electrode 106 as described above is a region that avoids having an uneven thickness. For example, the relatively planar partial region of the gate electrode 106 may exclude a region that corresponds to the first through-via 140. In some embodiments, the first thickness $T_3$ may be greater than or equal to the third thickness $T_4$. In some embodiments, the first thickness $T_3$ may be in a range from about 200 nm to 1000 nm (200 nm first thickness $T_3 \leq 1000$ nm). In some embodiments, the first thickness $T_3$ may be in a range from about 500 nm to 1000 nm (500 nm≤first thickness $T_3 \leq 1000$ nm). It should be noted that, if the first thickness $T_3$ is too small (first thickness $T_3 \leq 200$ nm), the first circuit 146 may not be able to effectively decrease the capacitance or resistance. On the contrary, if the first thickness $T_3$ is too great (first thickness $T_3 > 1000$ nm), the stress on the substrate may be increased or cause the substrate to bend or crack, or increase the manufacturing cost.

In some embodiments, the material of the first circuit 146 may include transparent conductive materials or metallic conductive material, but is not limited thereto. The metallic conductive materials or transparent conductive materials are as described above and will not be repeated here. In some embodiments, the material in the first through-via 140 and the material of the first circuit 146 (the scan line) may be the same or different. In some embodiments, the material of the gate electrode 106 and the material of the first circuit 146 may be the same or different.

Figure 2B:
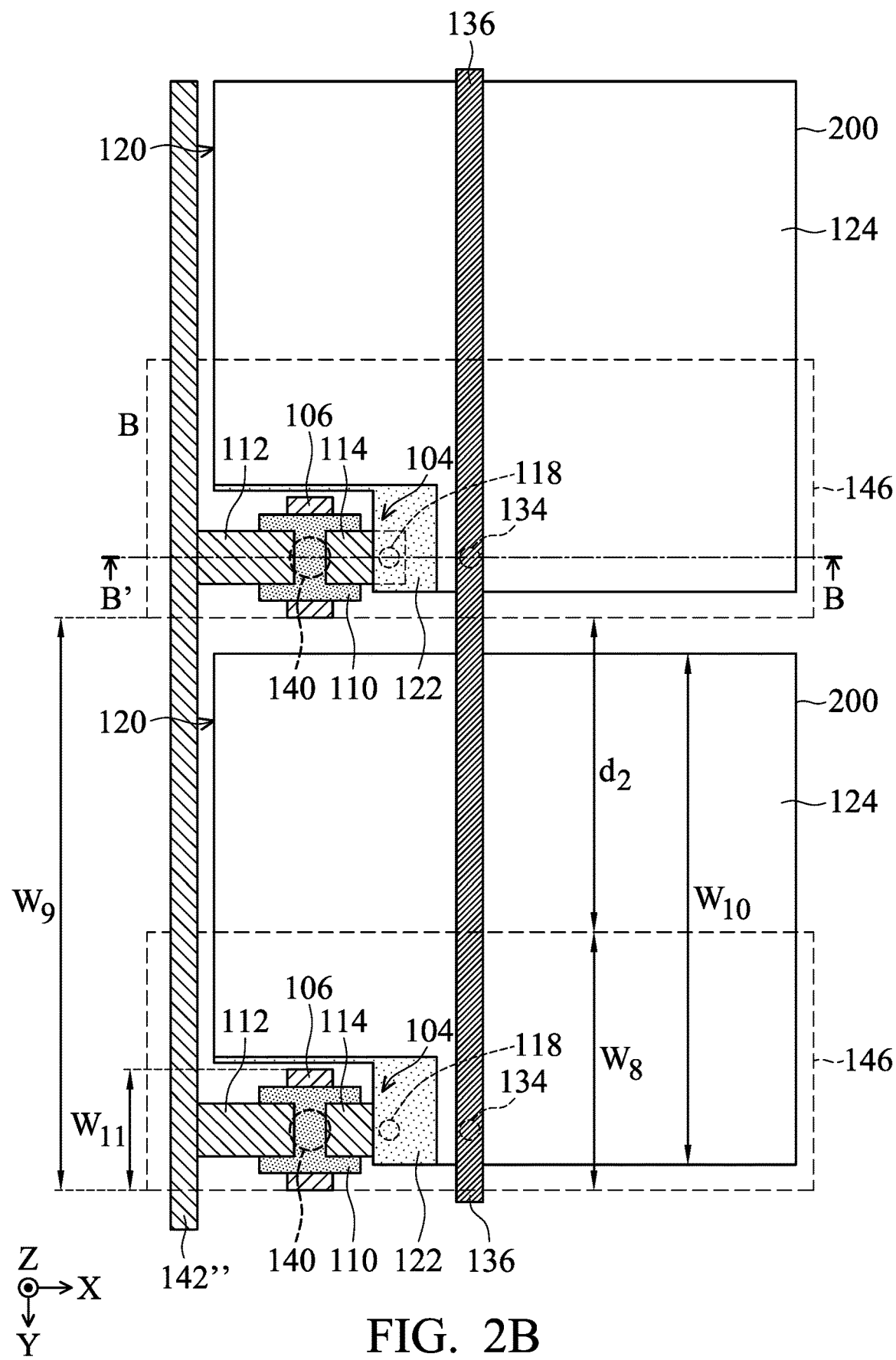
FIG. 2B illustrates a top view of a partial structure of a detection device in accordance with some embodiments of the present disclosure.

Next, referring to FIG. 2B, FIG. 2B illustrates a top view of a partial structure of the detection device 300 in some embodiments. FIG. 2B is a schematic view of a partial pixel unit of the detection device 300 in FIG. 2A. It should be understood that, although two pixel units 200 are illustrated in FIG. 2B, the detection device 300 may comprise a plurality of pixel units 200. Moreover, some of the elements are omitted in FIG. 2B to illustrate the relationship of the data line 142", the first circuit 146 (the scan line), the switch element 104 and the light sensing element 120.

As shown in FIG. 2B, the detection device 300 comprises the first circuit 146 that extends along the X direction and the data line 142" that intersects with the first circuit 146 in the normal direction of the substrate 102 (Z direction). Since the first circuit 146 is disposed on the second surface 102b of the substrate 102, the first circuit 146 is represented by dotted line. The first circuit 146 and the data line 142" intersect with each other in the Z direction to define the pixel unit 200. The pixel unit 200 may comprise the switch element 104. In some embodiments, the pixel unit 200 where the first circuit 146 (the scan line) and the data line 142" intersect may have a profile of rectangle, diamond, or any other suitable shapes in the normal direction of the substrate 102, which is not particularly limited.

In this embodiment, the gate electrode 106 and the first circuit 146 are electrically connected, and the first electrode 112 and the data line 142" are electrically connected. Specifically, the gate electrode 106 is electrically connected to the first circuit 146 through the first through-via 140 that penetrates the substrate 102. The first through-via 140 (which is represented by the dotted circle) is disposed below and corresponding to the first electrode 112. As described above, the first circuit 146 is disposed on the second surface 102b of the substrate 102. The size of the first circuit 146 may be not restricted by other elements disposed on the first surface 102a. Therefore, the first circuit 146 may have a wider width or a thicker thickness, and the capacitance of the first circuit 146 or resistance of the first circuit 146 may be decreased.

In some embodiments, the first circuit 146 may have an eighth width $W_8$ in the Y direction. The Y direction is defined as the direction that is substantially parallel to the data line 142". The eighth width $W_8$ may be the maximum width of the scan line 146 in the Y direction. In FIG. 2B, the pixel unit 200 has a ninth width $W_9$ in the Y direction. The ninth width $W_9$ may be the width of the pixel area between the two adjacent first circuits 146 in the Y direction. The ninth width $W_9$ may also represent the width distance in the Y direction from the lowermost end of the first circuit 146 to the lowermost end of the next adjacent first circuit 146. Furthermore, the gate electrode 106 has an eleventh width $W_{11}$ in the Y direction. In some embodiments, the eighth width $W_8$ may be greater than or equal to the eleventh width $W_{11}$. In some embodiments, the eighth width $W_8$ may be in a range from about 10 um to 50 um (10 um≤$W_8$≤50 um). In some embodiments, the eighth width $W_8$ may be in a range from about 30 um to 50 um (30 um≤$W_8$≤50 um).

In some embodiments, the ratio of eighth width $W_8$ and the ninth width $W_9$ is about 5% to 20% (5%≤eighth width $W_8$/ninth width $W_9$≤20%), or about 10% to 20% (10%≤eighth width $W_8$/ninth width $W_9$≤20%). It should be noted that, if the eighth width $W_8$ is too small (eighth width $W_8$/ninth width $W_9$≤5%), the scan line may not effectively reduce the capacitance or resistance. On the contrary, if the eighth width $W_8$ is too great (eighth width $W_8$/ninth width $W_9$>20%), the distance between the adjacent scan lines may be too small, it may result in the risk of short circuit, or it may increase the manufacturing cost. A tenth width $W_{10}$ (the width of the detection area) of the light sensing element 120 may not be restricted by the first circuit 146. In addition, the tenth width $W_{10}$ may be defined as the maximum width of the above detection area in the Y direction. According to the design of this example, the size of detection area may be increased, or the detection performance may be increased. The first circuit 146 may not affect the adjacent first circuit 146. However, a safe space $d_2$ should be maintained for reducing short circuit. The above space $d_2$ is defined as the distance between the two adjacent first circuits 146.

In some embodiments, the first circuit 146 may at least partially overlap the switch element 104 in the Z direction. In some embodiments, the first circuit 146 may at least partially overlap the light sensing element 120 in the Z direction. In some embodiments, when the switch element 104 is a bottom gate transistor, the first through-via 140 may partially overlap the first electrode 112 or the second electrode 114 in the Z direction. In some embodiments, when the switch element 104 is a top gate transistor, the gate electrode 106 may avoid being electrically connected to the first electrode 112 or the second electrode 114, so the first through-via 140 does not overlap the first electrode 112 or the second electrode 114 in the Z direction.

Figure 3:
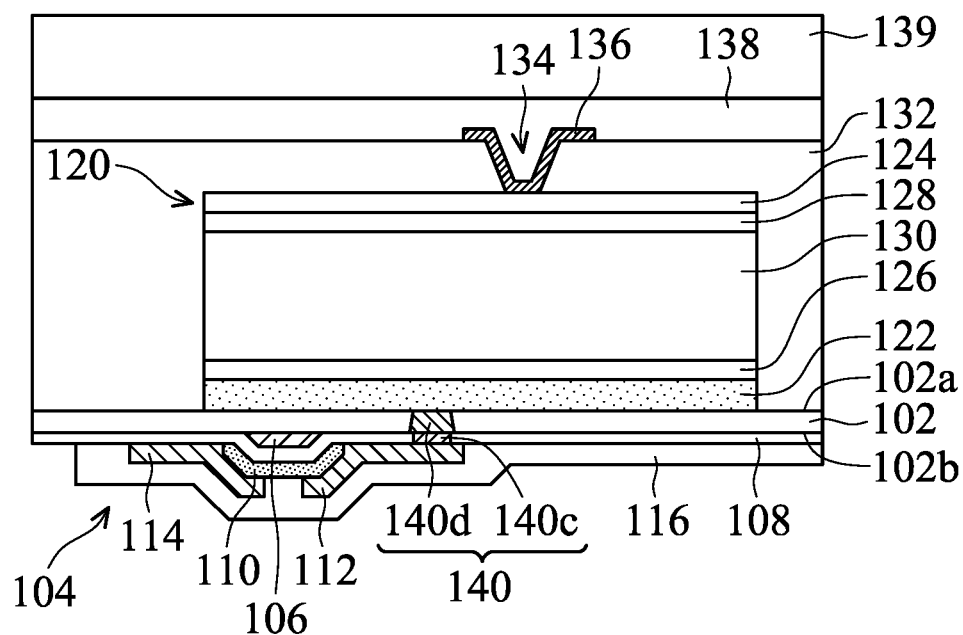
FIG. 3 illustrates a cross-sectional view of a partial structure of a detection device in accordance with some embodiments of the present disclosure.

FIG. 3 illustrates a cross-sectional view of a partial structure of a detection device 500 in some embodiments. The difference between the embodiments shown in FIG. 3 and FIG. 1A is that the switch element 104 is disposed on the second surface 102b of the substrate 102 in the detection device 500 in FIG. 3. In this embodiment, the first through-via 140 is disposed corresponding to the first electrode 112 of the switch element 104 and the first through-via 140 penetrates through the substrate 102. The first through-via 140 is disposed between the first electrode 112 of the switch element 104 and the first electrode layer 122 of the light sensing element 120. The switch element 104 may electrically connect to the light sensing element 120 through the first through-via 140. In one embodiment, the switch element 104 and the light sensing element 120 are disposed at different sides of the substrate 102.

In FIG. 3, the first circuit 142 (the data line) and the first circuit 146 (the scan line) may be disposed on the side of the substrate 102 that is different from that where the light sensing element 120 is disposed. In other words, the first circuit 142 and the first circuit 146 are disposed on the second surface 102b of the substrate 102, the light sensing element 120 is disposed on the first surface 102a of the substrate 102. The first circuit 146 may be electrically connected to the gate electrode 106, and the first circuit 142 may be electrically connected to the first electrode 112. The first circuit 142 and the first circuit 146 are interlaced with each other to define the pixel unit.

As described above, the switch element 104 is disposed on the second surface 102b of the substrate 102. The switch element 104 and the light sensing element 120 are electrically connected through the first through-via 140. The sizes of the switch element 104 and the size of the light sensing element 120 may be not be restricted by each other. In one embodiment, the light sensing element 120 may have a greater size, or the light sensing element 120 may increase the detection area. The light sensing element 120 may reduce the capacitance, which may be caused by the interference of the switch element 104, the first circuit 146 or the first circuit 142, so the light sensing element 120 may reduce the noise.

Figure 4A:
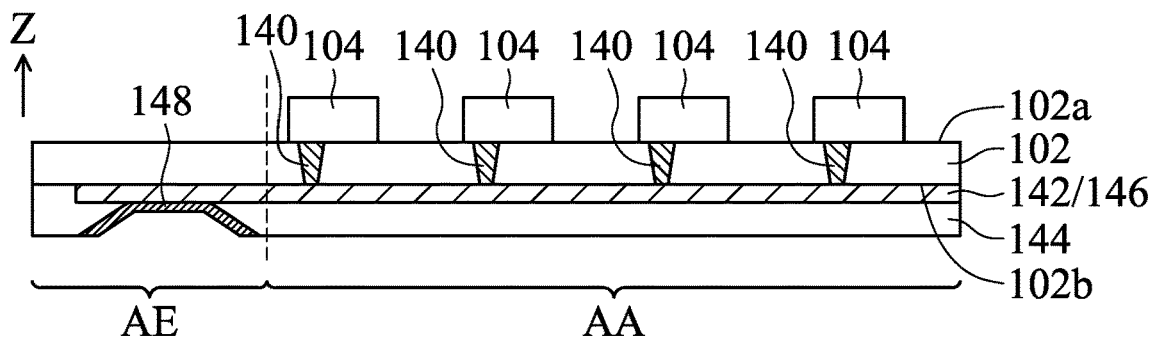
FIGS. 4A-4C are schematic views showing the connection between the circuit and the conductive pad in the detection device in accordance with some embodiments of the present disclosure.
Figure 4B:
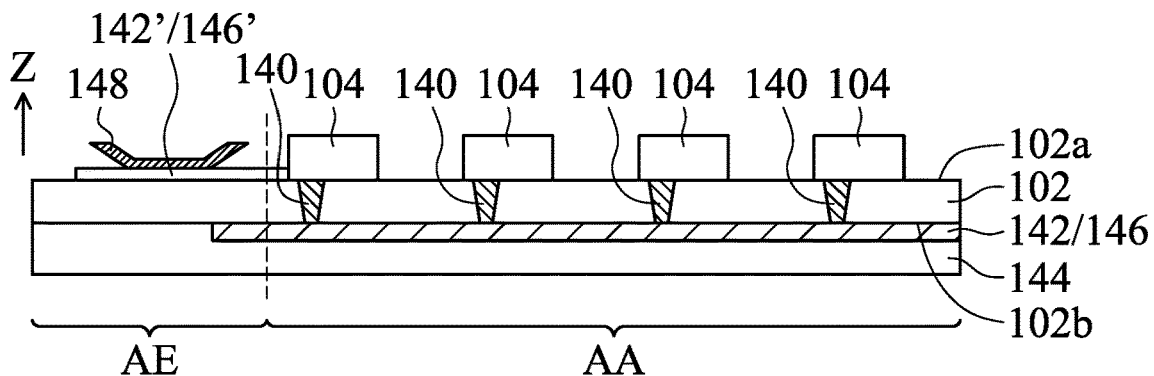
Figure 4C:
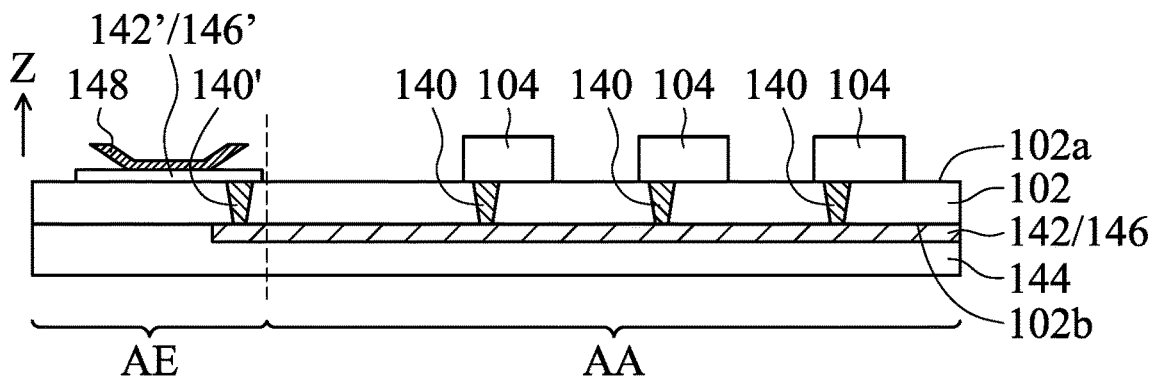

Next, referring to FIGS. 4A-4C, FIGS. 4A-4C are schematic views showing the connection between the first circuit 142 (data line) and a conductive pad 148, or between the first circuit 146 (scan line) and the conductive pad 148 in the detection device in some embodiments. It should be understood that, some of the elements are omitted in FIGS. 4A-4C to clearly illustrate the electrical connection between the first circuit 142 and the conductive pad 148, or the electrical connection between the first circuit 146 and the conductive pad 148.

As described above, the detecting device comprises a plurality of pixel units 200 arranged thereon. The substrate 102 has a detection area AA and a non-detection area AE. The non-detection area AE may be disposed on the peripheral region of the detection area AA. More specifically, the pixel unit 200 may be disposed on the detection area AA, and the circuit region may be disposed on the non-detection area AE. The detection device may further comprise the conductive pad 148 disposed on the non-detection area AE. The conductive pad 148 may be used to electrically connect to the external circuit by a flexible circuit board (COF), a printed circuit board assembly (PCBA), a flexible printed circuit (FPC) or other connection method to the external circuit. The conductive pad 148 may be disposed on the first surface 102a or the second surface 102b of the substrate 102 corresponding to the non-detection area AE, but it is not limited thereto.

As shown in FIG. 4A, the conductive pad 148 is disposed on the second surface 102b of the substrate 102 and corresponds to the non-detection area AE. The switch element 104 is electrically connected to the conductive pad 148 through the first circuit 142 or the first circuit 146 disposed on the second surface 102b. In one embodiment, the conductive pad 148 disposed on the second surface 102b may be electrically connected to the first circuit 142 or the first circuit 146 disposed on the second surface 102b, and additional wiring may be omitted. In some other embodiments, the conductive pad 148 is disposed on the second surface 102b and corresponds to the non-detection area AE, and the conductive pad 148 may be electrically connected to the first circuit 142 or the first circuit 146 disposed on the second surface 102*b* through another conductive layer (not illustrated).

As shown in FIG. 4B, in some embodiments, the conductive pad 148 may be disposed on the first surface 102*a* of the substrate 102 and correspond to the non-detection area AE. The switch element 104 that is near the end boundary of the detection area AA, such as the end boundary of the detection area AA adjacent to the non-detection area AE, may electrically connect the first circuit 142 or the first circuit 146 on the second surface 102*b* with the conductive pad 148 on the first surface 102*a* through the first through-via 140, and the first through-via 140 is disposed corresponding to the endmost switch element 104. In some embodiments, the first circuit 142 (and/or the first circuit 146) may be electrically connected to the conductive pad 148 through the first through-via 140 and the second circuit 142' (and/or the second circuit 146'), and the second circuit 142' (and/or the second circuit 146') is disposed on the first surface 102*a*. For example, the second circuit 142' may be the first electrode 112 of the switch element 104 that extends from the detection area AA to the non-detection area AE. However, the second circuit 142' may be another conductive material that is electrically connected to the first electrode 112 in some embodiments. For example, the second circuit 146' may be the gate electrode 106 of the switch element 104 that extends from the detection area AA to the non-detection area AE. In some embodiments, the second circuit 146' may be another conductive material, and the second circuit 146' is electrically connected to the gate electrode 106. In some other embodiments, the conductive pad 148 on the first surface 102*a* may be electrically connected to the first circuit 142 (and/or the first circuit 146) on the second surface 102*b* through the first through-via 140 that is not disposed corresponding to the endmost switch element 104. In other words, the conductive pad 148 may electrically connected to the first circuit 142 (and/or the first circuit 146) through at least one of the first through-via 140, which is not particular limited.

As shown in FIG. 4C, in some embodiments, the conductive pad 148 may be disposed on the first surface 102*a* of the substrate 102 and correspond to the non-detection area AE. In addition, a second through-via 140' may be disposed corresponding to the non-detection area AE, and the first circuit 142 (and/or the first circuit 146) may be electrically connected to the conductive pad 148 through the second through-via 140'. In some embodiments, the second through-via 140' and the conductive pad 148 may be electrically connected to each other through the second circuit 142' (and/or the second circuit 146'), the second circuit 142' or the second circuit 146' may be disposed on the non-detection area AE.

The material of the conductive pad 148 may include transparent conductive materials or metallic conductive materials. The metallic conductive materials or transparent conductive materials are as described above and will not be repeated here.

Next, referring to FIGS. 5A-5J, FIGS. 5A-5J illustrate the cross-sectional views of a partial structure of the detection device during the various stages of the manufacturing process in some embodiments. FIGS. 5A-5J illustrate the exemplary manufacturing process of the detection device 100 as shown in FIG. 1A. The manufacturing process of the detection device 300 as shown in FIG. 2A or the detection device 500 as shown in FIG. 3 may be similar. It should be understood that, some additional operations may be provided before, during, or after the stages of the manufacturing process of the detection device described in FIGS. 5A-5J. In some embodiments, some of the stages described below may be replaced or be eliminated. Other elements can be added to the detection device. In some embodiments, some of the features described below can be replaced or eliminated.

Figure 5A:
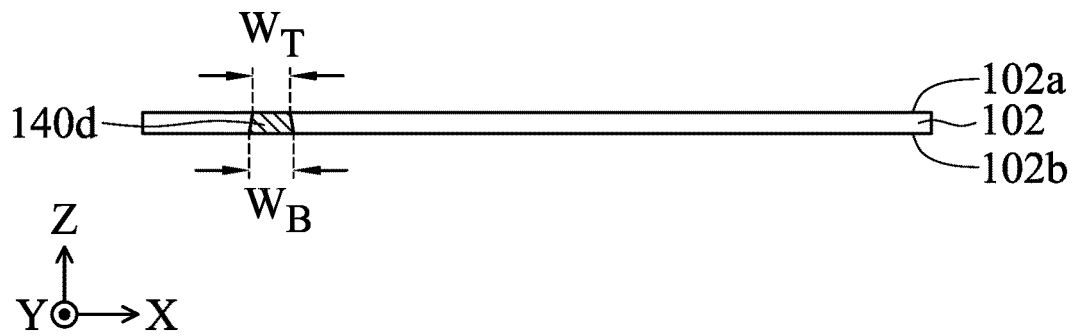
FIGS. 5A-5J illustrate cross-sectional views of a partial structure of a detection device during the various stages of the manufacturing process in accordance with some embodiments of the present disclosure.

First, referring to FIG. 5A, the substrate 102 is provided. The through-hole penetrates the substrate 102, and the conductive material 140*d* is disposed in the through-hole to form a through-via. For example, a patterning process may be performed on the substrate 102 to form the through-hole. The patterning process may be performed on the first surface 102*a* of the substrate 102 or the second surface 102*b* of the substrate 102. After the patterning process, the conductive material 140*d* may be disposed in the through-hole. In some embodiments, the patterning process may begin from the second surface 102*b* of the substrate 102 to form the through-hole that penetrates through the second surface 102*b* and the first surface 102*a*. As such, an area of the through-hole on the second surface 102*b* in the normal direction of the substrate 102 (Z direction) may be greater than or equal to an area of the through-hole on the first surface 102*a* in the Z direction. In other words, the width $W_B$ of the through-hole on the second surface 102*b* may be greater than or equal to the width $W_T$ of the through-hole on the first surface 102*a*. For example, the width $W_B$ may be the maximum width of the through-hole on the second surface 102*b*, the width $W_T$ may be the maximum width of the through-hole on the first surface 102*a*. However, in some embodiments, the patterning process may begin from the first surface 102*a* of the substrate 102. As such, the area of the through-hole on the second surface 102*b* in the Z direction may be less than or equal to the area of the through-hole on the first surface 102*a* in the Z direction. In other words, the width $W_B$ of the through-hole on the second surface 102*b* may be less than or equal to the width $W_T$ of the through-hole on the first surface 102*a*, but is not limited to.

In addition, in some embodiments, except being disposed in the through-hole, a portion of the conductive material 140*d* may be disposed on the first surface 102*a* or the second surface 102*b* to form a structure similar to the conductive pad (not illustrated), but it is not limited thereto. Specifically, after the through-hole is formed, the conductive pad structure as described above may be disposed on the first surface 102*a* or the second surface 102*b*, and the conductive material 140*d* may be subsequently disposed in the through-hole. In some embodiments, after the through-hole is disposed in the substrate 102, the conductive material 140*d* may be disposed in the through-hole in advance, and the conductive pad structure as described above may be subsequently disposed on the first surface 102*a* or the second surface 102*b*. The above patterning process for forming the through-hole may include a photolithography process and an etching process. The photolithography process may include photoresist coating (e.g., spin coating), soft baking, hard baking, mask aligning, exposure, post-exposure baking, developing the photoresist, rinsing, drying, and other suitable processes, but is not limited thereto. The etching process may include dry etching process or wet etching process. In addition, chemical vapor deposition (CVD), sputtering, resistance heating evaporation, electron beam evaporation, pulsed laser deposition, any other suitable deposition processes, or a combination thereof may be used to fill the conductive material into the through-hole. The chemical vapor deposition may include low-pressure chemical vapor deposition (LPCVD), low-temperature chemical vapor deposition (LTCVD), rapid thermal chemical vapor deposition (RT- CVD), plasma enhanced chemical vapor deposition (PECVD), atomic layer deposition (ALD), or any other suitable method, but is not limited thereto.

Figure 5B:
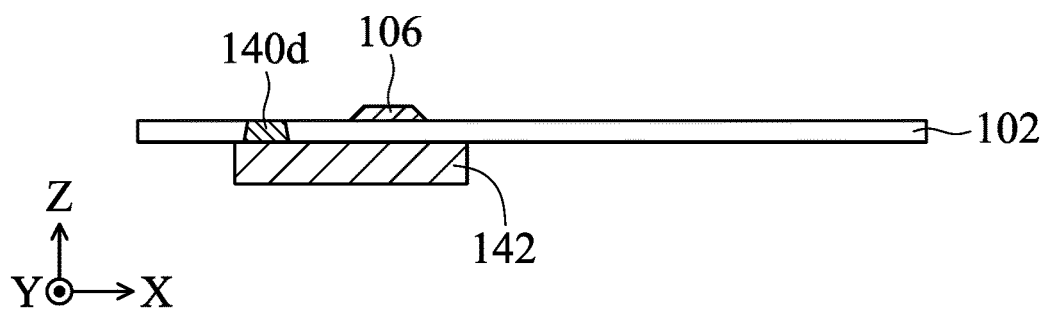

Next referring to FIG. 5B, the first circuit 142 (the data line) is disposed on the second surface 102b and corresponds to the through-hole, and the gate electrode 106 is disposed on the first surface 102a. The first circuit 142 may at least partially overlap the gate electrode 106 in the Z direction. In some embodiments, after the conductive material 140d is disposed and the gate electrode 106 has not been disposed, a thin insulating layer (not illustrated) may be further disposed on the conductive material 140d. When the substrate with the conductive material 140d in the through-hole needs to be transported to other places, the thin insulating layer may be used to reduce moisture or other foreign substances from affecting the filled conductive material 140d during the transportation process. The thin insulating layer may subsequently be etched to form the through-hole by the same patterning process, which may include photolithography processes and etching processes.

In some embodiments, the conductive material may be formed by chemical vapor deposition, sputtering, resistance heating evaporation, electron beam evaporation, pulsed laser deposition, any other suitable deposition processes, or a combination thereof, but is not limited thereto. The first circuit 142 and the gate electrode 106 may be formed by using the patterning process. The patterning process may include photolithography process or etching process. The photolithography process and etching process are as described above and will not be repeated here.

Figure 5C:
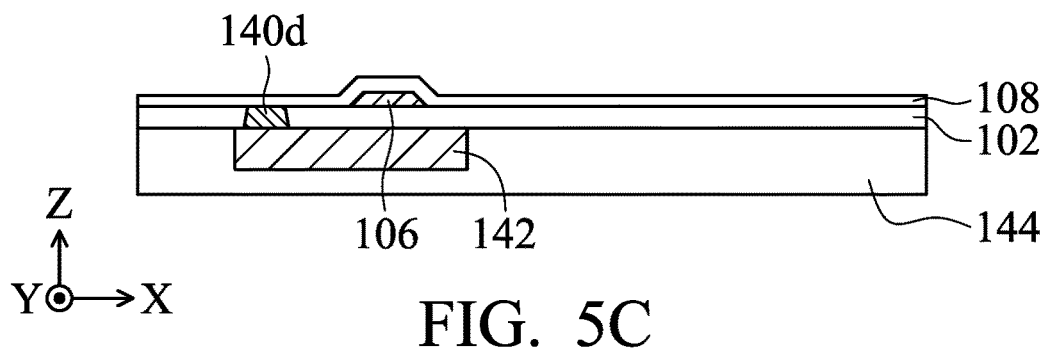

Next, referring to FIG. 5C, the gate dielectric layer 108 is disposed on the first surface 102a and the gate electrode 106, and the third insulating layer 144 is disposed on the second surface 102b and the first circuit 142. The first circuit 142 is disposed between the third insulating layer 144 and the substrate 102.

In some embodiments, the gate dielectric layer 108 and the third insulating layer 144 may be formed by chemical vapor deposition, physical vapor deposition (PVD), spin coating process, any other suitable methods, or a combination thereof. The gate dielectric layer 108 is disposed on the first surface 102a the gate electrode 106.

Figure 5D:
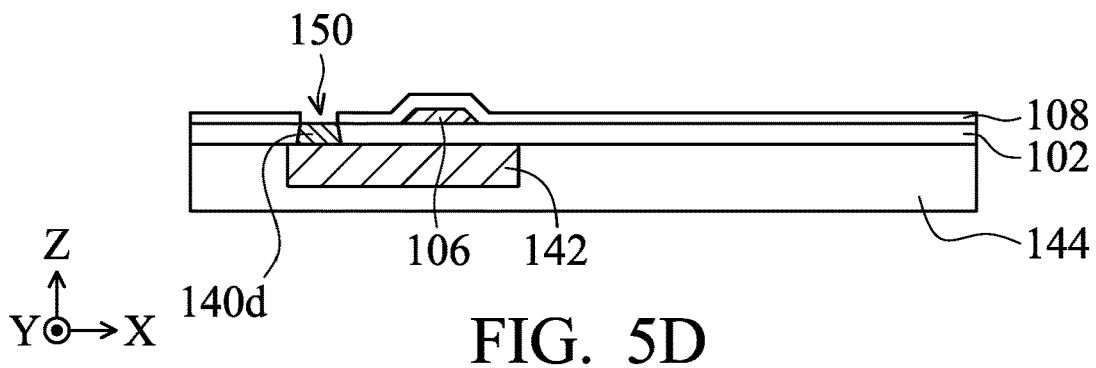

Next, referring to FIG. 5D, a portion of the gate dielectric layer 108 is removed by the patterning process to form a through-hole 150. The through-hole 150 penetrates through the gate dielectric layer 108 that is disposed on the conductive material 140d, and exposes the top surface of the conductive material 140d. In FIG. 5D, the patterning process of the gate dielectric layer 108 and the patterning process of the substrate 102 may be separate steps. However, in some embodiments, the gate dielectric layer 108 and the substrate 102 or the thin insulating layer as described above may be patterned in the same step or different steps to form the through-hole.

Figure 5E:
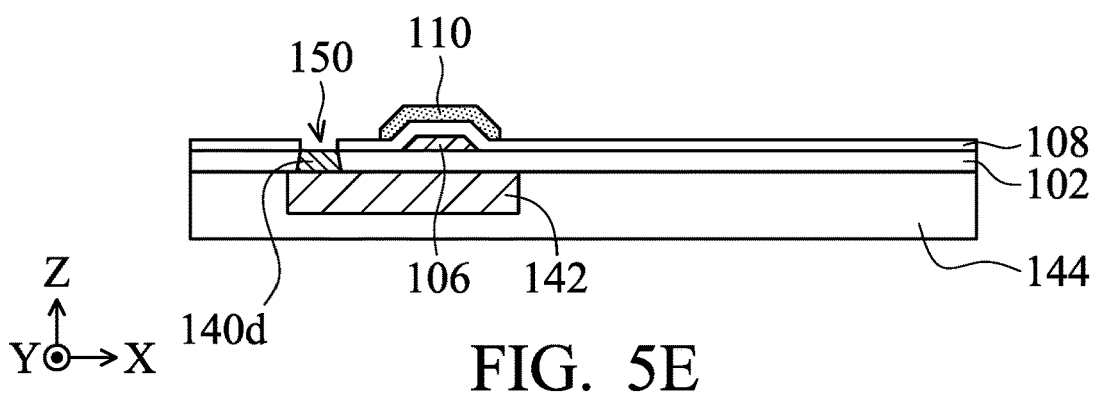

Next, referring to FIG. 5E, the semiconductor layer 110 is disposed on the gate dielectric layer 108. The semiconductor layer 110 and the gate electrode 106 overlap in the Z direction.

In some embodiments, a semiconductor material may be disposed by chemical vapor deposition, physical vapor deposition, a spin coating process, any other suitable deposition method, or a combination thereof, but is not limited thereto. Then, the semiconductor material is patterned by the patterning process to form the semiconductor layer 110.

Figure 5F:
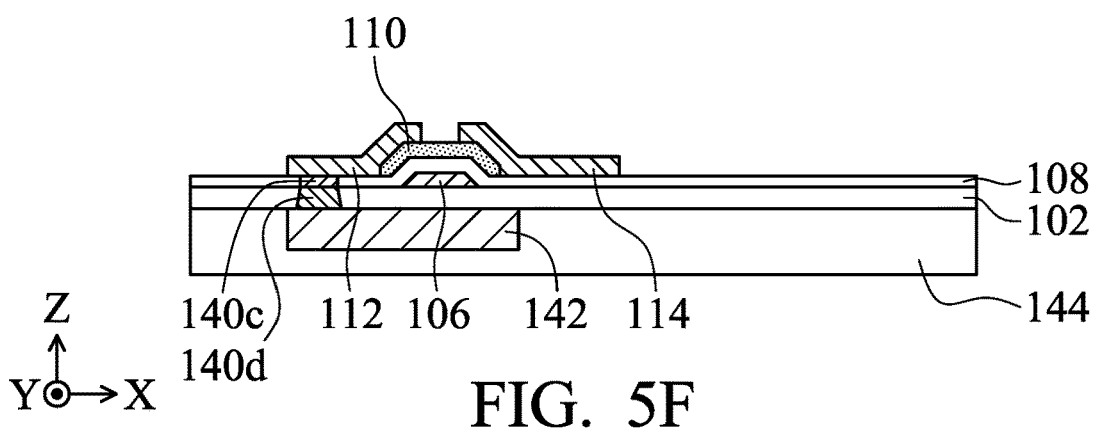

Next, referring to FIG. 5F, the first electrode 112 and the second electrode 114 are disposed on a portion of the gate dielectric layer 108 and the semiconductor layer 110 respectively. The first electrode 112 and the second electrode 114 are disposed on the opposite sides of the semiconductor layer 110, and expose a portion of the surface of the semiconductor layer 110. The first electrode 112 may be disposed into the through-hole 150 in some embodiments. The material of the first electrode 112 may be the same to the conductive material 140c of the first through-via 140. In some embodiments, the conductive material 140c may be disposed in the through-hole 150 before the first electrode 112 is disposed. Specifically, the first through-via 140 may include the conductive material 140c penetrating the gate dielectric layer 108, and the conductive material 140d penetrating the substrate 102. The conductive material 140c and the conductive material 140d may contact or be electrically connected to each other. As described above, in some embodiments, the gate dielectric layer 108 and the substrate 102 may be patterned in the same step. Therefore, the conductive material of the first through-via 140 may be the same material.

Figure 5G:
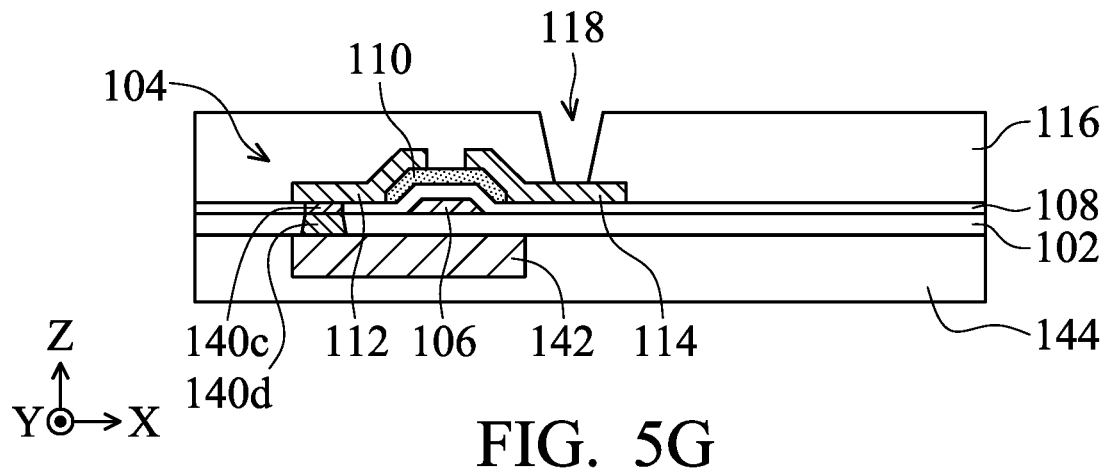

Next, referring to FIG. 5G, the first insulating layer 116 is disposed on the first electrode 112, the second electrode 114, the semiconductor layer 110 and the gate dielectric layer 108. Thereafter, a portion of the first insulating layer 116 is removed by the patterning process to form the through-hole 118. The through-hole 118 may expose a portion of the surface of the second electrode 114.

Then, the first insulating layer 116 may be patterned by the patterning process. In addition, the above patterning process may include photolithography process or etching process. The photolithography process and etching process are as described above and will not be repeated here.

Figure 5H:
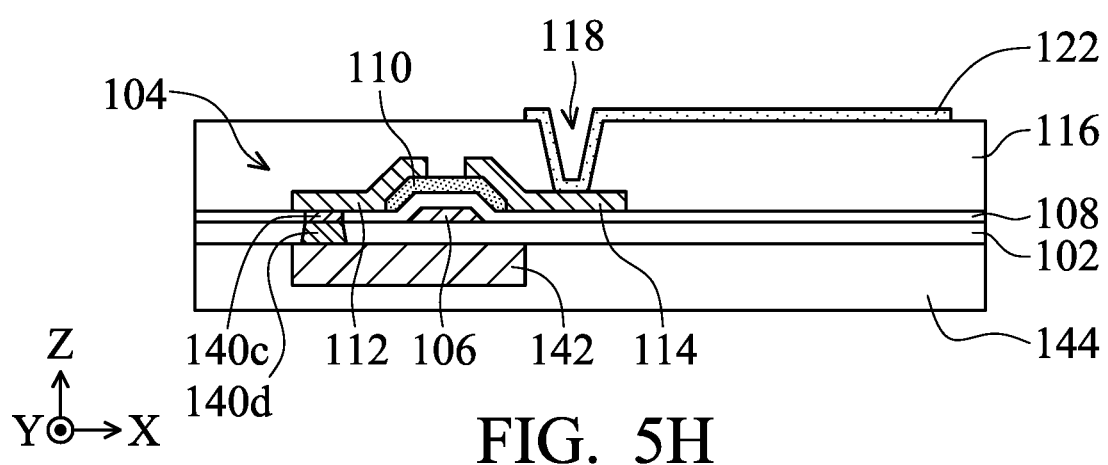

Next, referring to FIG. 5H, the first electrode layer 122 may be disposed on the first insulating layer 116, and the first electrode layer 122 may be disposed in the through-hole 118. The first electrode layer 122 is disposed on a portion of the surface of the first insulating layer 116, the sidewall of the through-hole 118 and a portion of the surface of the second electrode 114. For example, the first electrode layer 122 may serve as the bottom electrode of the light sensing element 120, and the light sensing element 120 may be disposed subsequently.

Figure 5I:
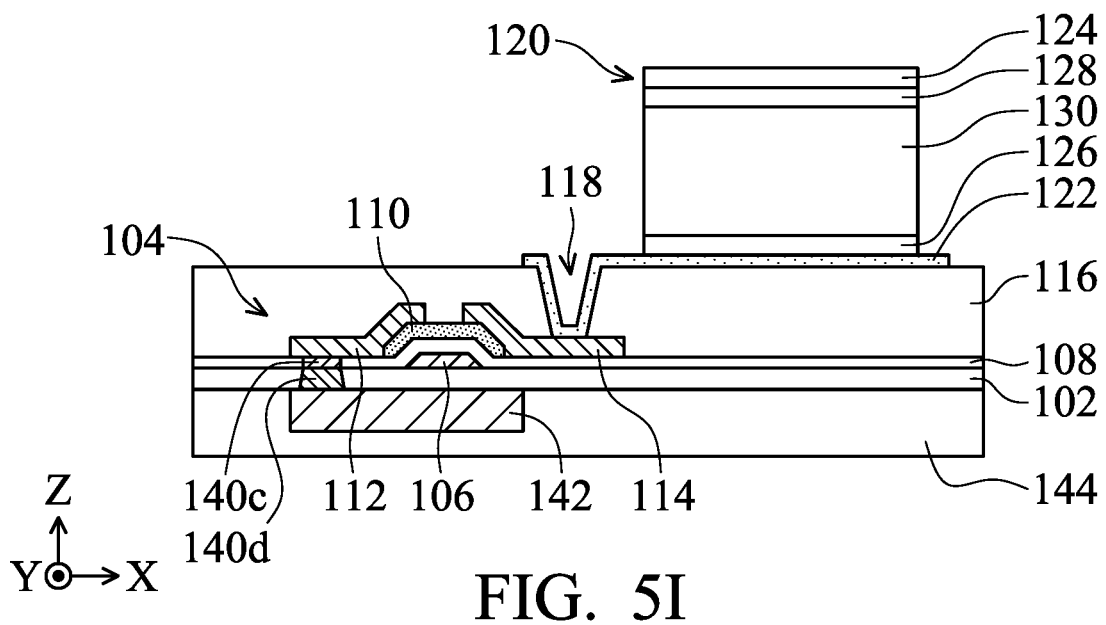

Next referring to FIG. 5I, the first-type semiconductor layer 126, the active layer 130, the second-type semiconductor layer 128 and the second electrode layer 124 are sequentially disposed on the first electrode layer 122 to form the light sensing element 120. For example, the second electrode layer 124 may serve as a top electrode of the light sensing element 120.

In some embodiments, the first-type semiconductor layer 126, the active layer 130, the second-type semiconductor layer 128 and the second electrode layer 124 may also be disposed by chemical vapor deposition, sputtering, resistance heating evaporation, electron beam evaporation, any other suitable deposition methods, or a combination thereof, and/or the patterning process, but is not limited thereto. The patterning process is as described above and will not be repeated here.

Figure 5J:
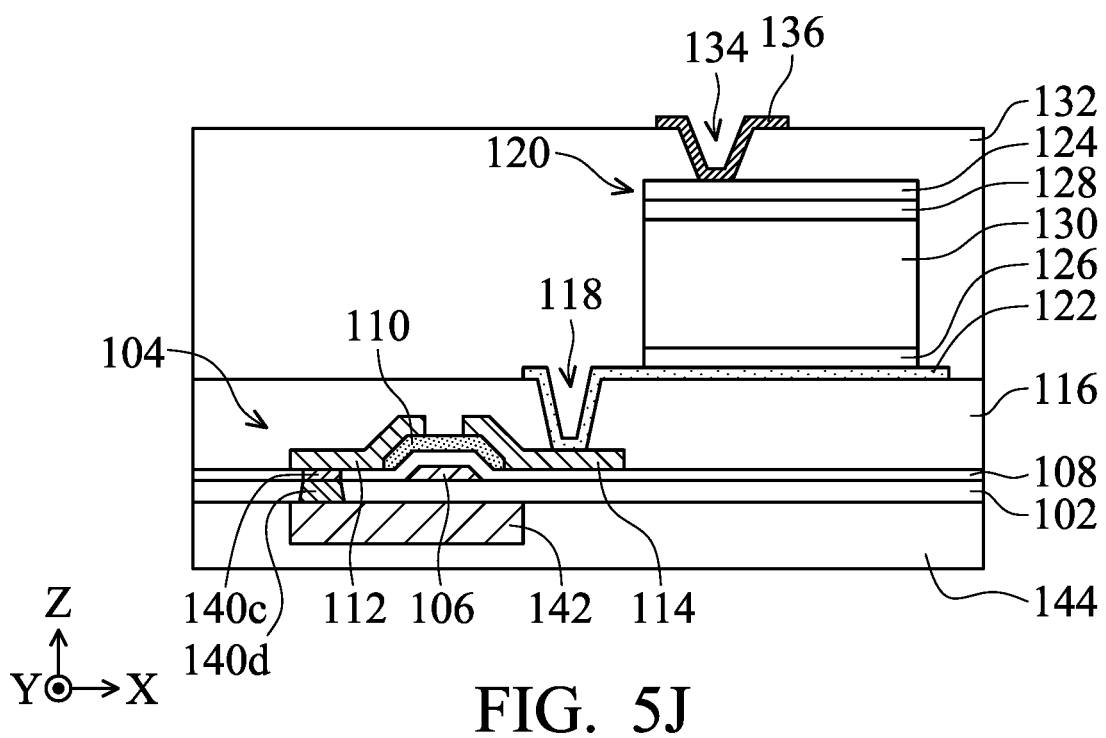

Next, referring to FIG. 5J, the second insulating layer 132 is disposed on the light sensing element 120, the first electrode layer 122 and the first insulating layer 116. Thereafter, a portion of the second insulating layer 132 is removed by the patterning process to form the through-hole 134. The through-hole 134 exposes a portion of the second electrode layer 124 of the light sensing element 120.

In some embodiments, an insulating material may be formed by chemical vapor deposition, physical vapor deposition, a spin coating process, any other suitable deposition method, or a combination thereof, but is not limited thereto. Then, the insulating material is patterned by the patterning process (such as etching processes) to form the second insulating layer 132. In addition, the patterning process is as described above and will not be repeated here.

Still referring to FIG. 5J, the third electrode layer 136 is disposed on the second insulating layer 132 and in the through-hole 134. Specifically, the third electrode layer 136 may be disposed on a portion of the surface of the second insulating layer 132, the sidewall of the through-hole 134 or a portion of the surface of the second electrode layer 124.

Next, the fourth insulating layer 138 may be further disposed on the second insulating layer 132, and the third electrode layer 136 (referring to FIG. 1A).

Next, the scintillating layer 139 maybe further disposed on the fourth insulating layer 138 (referring to FIG. 1A). In some embodiments, the scintillating layer 139 may be formed by chemical vapor deposition, physical vapor deposition, a spin coating process, any other suitable deposition method, or a combination thereof, but is not limited thereto. To summarize the above, the first circuit 142 (the data line), the first circuit 146 (the scan line) or the thin-film transistor may be transferred and disposed on an opposite side of the substrate to the side where the photodiode is disposed. Therefore, the size of the data line or the scan line may be not restricted by the photodiode or the thin-film transistor. The data line (and/or the scan line) may have a greater width or a greater thickness. Accordingly, the capacitance of the data line (and/or the scan line) or the resistance of the data line (and/or the scan line) may be decreased, and the noise may be reduced. Therefore, the quality of the images produced by the detection device may be enhanced, or the performance of the detecting device may be enhanced.

It should be noted that one with ordinary skill in the art will understand that the drain and source described in the present disclosure are interchangeable, and they are not particularly limited herein.

Although some embodiments and their advantages have been described in detail, it should be understood that various changes, substitutions and alterations can be made herein without departing from the spirit and scope of the disclosure as defined by the appended claims. For example, it will be readily understood by one of ordinary skill in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A detection device, comprising:
a substrate having a first surface and a second surface, the first surface is disposed opposite to the second surface;
a switch element disposed on the first surface;
a light sensing element disposed on the first surface and electrically connected to the switch element; and
a first circuit disposed on the second surface,
wherein the substrate comprises a first through-via, and the switch element is electrically connected to the first circuit through the first through-via,
wherein the switch element is disposed between the light sensing element and the first circuit in a normal direction of the substrate.

2. The detection device as claimed in claim 1, wherein the first circuit overlaps the switch element in the normal direction of the substrate.

3. The detection device as claimed in claim 1, wherein the first circuit overlaps the light sensing element in the normal direction of the substrate.

4. The detection device as claimed in claim 1, wherein the switch element comprises a first electrode, the first electrode is electrically connected to the first circuit through the first through-via, the first circuit has a first thickness, the first electrode has a second thickness, and the first thickness is greater than or equal to the second thickness.

5. The detection device as claimed in claim 1, wherein the switch element comprises a first electrode, and the first electrode is electrically connected to the first circuit through the first through-via, wherein a first width of the first circuit is greater than or equal to a width of the first electrode.

6. The detection device as claimed in claim 1, wherein the switch element comprises a gate electrode, the gate electrode is electrically connected to the first circuit through the first through-via, the first circuit has a first thickness, the gate electrode has a third thickness, and the first thickness is greater than or equal to the third thickness.

7. The detection device as claimed in claim 1, wherein the switch element comprises a gate electrode, the gate electrode is electrically connected to the first circuit through the first through-via, and the first circuit has a first width, and the first width is greater than or equal to a width of the gate electrode.

8. The detection device as claimed in claim 1, wherein the substrate comprises a detection area and a non-detection area, a conductive pad is disposed on the second surface and corresponds to the non-detection area, and the conductive pad is electrically connected to the first circuit.

9. The detection device as claimed in claim 1, wherein the substrate comprises a detection area and a non-detection area, a conductive pad is disposed on the first surface and corresponds to the non-detection area, and the conductive pad is electrically connected to the first circuit by the first through-via.

10. The detection device as claimed in claim 1, wherein the substrate comprises a detection area and a non-detection area, a conductive pad is disposed on the first surface and corresponds to the non-detection area, a second through-via is disposed corresponding to the non-detection area, and the conductive pad is electrically connected to the first circuit through the second through-via.

11. The detection device as claimed in claim 1, further comprising an insulating layer, wherein the first circuit is disposed between the insulating layer and the substrate.

12. The detection device as claimed in claim 1, further comprising a scintillating layer disposed on the light sensing element.

13. The detection device as claimed in claim 1, wherein an area of the first through-via on the second surface in the normal direction of the substrate is different from an area of the first through-via on the first surface in the normal direction of the substrate.

14. The detection device as claimed in claim 1, wherein the first circuit is a data line or a scan line.

15. A detection device, comprising:
a substrate having a first surface and a second surface, wherein the first surface is disposed opposite to the second surface;
a switch element disposed on the second surface; and
a light sensing element disposed on the first surface,
wherein the substrate comprises a first through-via, and the switch element is electrically connected to the light sensing element through the first through-via,
wherein a material of the substrate comprises glass, quartz, sapphire, polycarbonate, polyimide, polyethylene terephthalate or a combination thereof.

16. The detection device as claimed in claim 15, wherein the switch element overlaps the light sensing element in a normal direction of the substrate.

17. The detection device as claimed in claim 15, wherein the light sensing element comprises a first electrode layer and a second electrode layer disposed on the first electrode layer, and the first electrode layer is electrically connected to the switch element through the first through-via.

18. The detection device as claimed in claim 17, wherein the first electrode layer comprises metallic conductive materials, and the second electrode layer comprises transparent conductive materials.

19. The detection device as claimed in claim 15, wherein an area of the first through-via on the second surface in a normal direction of the substrate is different from an area of the first through-via on the first surface in the normal direction of the substrate.

20. The detection device as claimed in claim 15, further comprising an insulating layer, wherein the switch element is disposed between the insulating layer and the substrate.

* * * * *